(12) United States Patent
Wang et al.

(10) Patent No.: US 9,705,502 B2
(45) Date of Patent: Jul. 11, 2017

(54) POWER SWITCH CONTROL BETWEEN USB AND WIRELESS POWER SYSTEM

(71) Applicants: Yang Wang, Suzhou (CN); Jie Jin, Suzhou (CN); Jianzhou Wu, Suzhou (CN)

(72) Inventors: Yang Wang, Suzhou (CN); Jie Jin, Suzhou (CN); Jianzhou Wu, Suzhou (CN)

(73) Assignee: NXP USA, INC., Austin, TX (US)

( * ) Notice: Subject to any disclaimer, the term of this patent is extended or adjusted under 35 U.S.C. 154(b) by 408 days.

(21) Appl. No.: 14/565,395

(22) Filed: Dec. 9, 2014

(65) Prior Publication Data

US 2016/0094226 A1    Mar. 31, 2016

(30) Foreign Application Priority Data

Sep. 25, 2014  (CN) .......................... 2014 1 0496133

(51) Int. Cl.
*H01H 35/00* (2006.01)
*H01H 83/00* (2006.01)
*H02H 3/00* (2006.01)
*H01H 47/00* (2006.01)
*H03K 19/0175* (2006.01)
*H03K 5/125* (2006.01)

(52) U.S. Cl.
CPC ..... *H03K 19/017509* (2013.01); *H03K 5/125* (2013.01)

(58) Field of Classification Search
CPC .. H03K 5/125; H03K 19/017509; H02J 5/005

USPC ................................................. 307/104, 130
See application file for complete search history.

(56) References Cited

U.S. PATENT DOCUMENTS

| 6,946,817 | B2 | 9/2005 | Fischer et al. |
| 7,528,582 | B1 | 5/2009 | Ferguson |
| 2009/0027010 | A1 | 1/2009 | Ha et al. |
| 2010/0277125 | A1* | 11/2010 | Ferguson ............. H02J 7/0021 320/128 |
| 2013/0313904 | A1* | 11/2013 | Kayama ................ H02J 1/00 307/26 |

FOREIGN PATENT DOCUMENTS

CN           102468684          5/2012

* cited by examiner

*Primary Examiner* — Carlos Amaya
(74) *Attorney, Agent, or Firm* — Charles E. Bergere

(57) ABSTRACT

An electrical system can selectively power a load via a USB connection or via another power source, such as a wireless power transfer path. An integrated switch controller determines whether to power the load via the USB connection or the other power sources and controls two external transistors via a single I/O pin connection to implement that determination. The switch controller determines the greater of two voltages: a voltage associated with the USB connection and a voltage associated with the other power source. The switch controller also determines whether there is a valid USB connection. The switch controller circuitry that controls the two external transistors is powered at the greater voltage to ensure that the external transistors are appropriately and securely turned on or off.

13 Claims, 3 Drawing Sheets

POWER SWITCH CONTROL BETWEEN USB AND WIRELESS POWER SYSTEM

BACKGROUND

The present invention relates to electronic devices and, more particularly, to powering an electronic device using either one of two different power sources, such as a wireless power supply and a USB connected power supply.

Certain electrical devices, such as certain consumer electronic devices, can be alternatively powered using either one of two different power sources. For example, U.S. Pat. No. 7,528,582 describes a power switch controller that enables an electrical device to be powered using either an AC adapter or a USB (universal serial bus) connected power supply. One disadvantage of this technique is that, when the power switch controller is implemented on an integrated circuit, two different I/O (input/output) pins of the integrated circuit are required to support the power switch control function.

It would be advantageous to have a power switch controller that does not require two different I/O pins of an integrated circuit.

BRIEF DESCRIPTION OF THE DRAWINGS

Other embodiments of the invention will become more fully apparent from the following detailed description, the appended claims, and the accompanying drawings in which like reference numerals identify similar or identical elements.

DETAILED DESCRIPTION

In one embodiment, the present invention provides an apparatus including switch control circuitry that controls USB power transfer circuitry used to selectively convey power from a USB connection to a load, where the load can also be powered by another power source. The switch control circuitry includes switch on/off circuitry that generates a control signal used to control the USB power transfer circuitry; voltage selection circuitry that (a) selects the greater of (i) a USB voltage corresponding to the USB connection and (ii) another voltage corresponding to the other power source and (b) powers the switch on/off circuitry based on the selected greater voltage; and USB detection circuitry that determines whether or not the USB connection is valid and controls the switch on/off circuitry accordingly.

Figure 1:
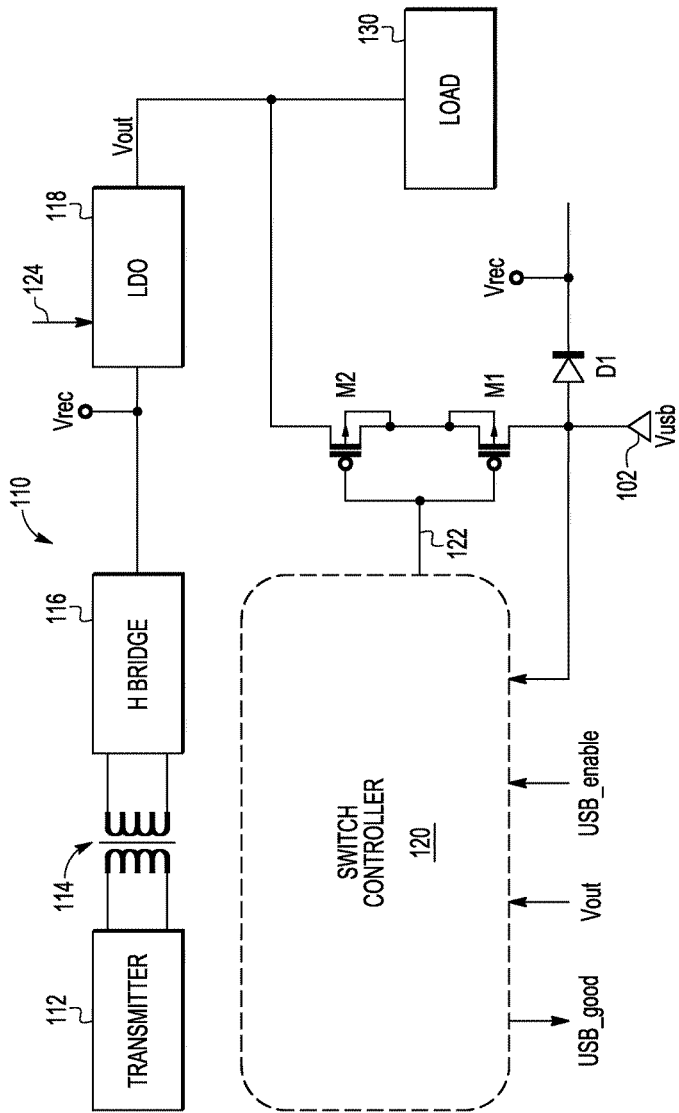
FIG. 1 is a schematic block diagram of an electrical system according to one embodiment of the invention.

Referring now to FIG. 1, a schematic block diagram of an electrical system 100 according to one embodiment of the present invention is shown. The electrical system 100 is designed to provide electrical power to a load 130, which may be, for example, a chip or a battery of a consumer electronic device. The load 130 can be powered by either one of two ways: via a wireless power transfer path 110 or via a valid USB connection at USB node 102. A switch controller 120 determines whether the load 130 should be powered wirelessly or via USB and controls p-type (e.g., PMOS) transistors M1 and M2 to execute that determination.

In certain implementations, the switch controller 120 is implemented in an integrated circuit, and transistors M1 and M2 are external to that integrated circuit. In that case and as illustrated in FIG. 1, the switch controller 120 controls transistors M1 and M2 via a single I/O connection pin 122. Note that the bulk terminals of transistors M1 and M2 are connected to their common channel terminals.

As shown in FIG. 1, the wireless power transfer path 110 is a conventional wireless power transfer path comprising a power transmitter 112, a transformer 114, an H bridge rectifier 116, and a low drop-out (LDO) rectifier 118. The H bridge rectifier 116 and the LDO rectifier 118 are part of a power receiver for AC (alternating current) electrical power transferred wirelessly from the power transmitter 112 via the transformer 114. The transformer coil on the transmitter side may be considered to be part of the power transmitter 112, while the transformer coil on the receiver side may be considered to be part of the power receiver. The H bridge rectifier 116 converts the received AC signal into a rectified DC (direct current) signal Vrec, and the LDO rectifier 118 further attenuates AC ripple in signal Vrec to generate a clean DC signal Vout that is applied to the load 130.

As described in further detail below, the switch controller 120 monitors (i) the voltage Vout from the wireless power transfer path 110 and (ii) the voltage Vusb at the USB node 102 to determine (i) whether or not there is a valid USB connection and (ii) if so, whether or not to power the load using that USB connection instead of using the wireless power transfer path 110.

If the switch controller 120 determines that there is a valid USB connection, then the switch controller 120 asserts control signal USB_good (e.g., logic 1). Otherwise, the switch controller 120 de-asserts USB_good (e.g., logic 0). The switch controller 120 also receives control signal USB_enable from another controller, e.g., an on- or off-chip software-based system controller (not shown in FIG. 1) for the system 100. In certain implementations of the system 100, the software-based system controller asserts USB_enable only after USB_good is asserted by the switch controller 120.

If both USB_good and USB_enable are asserted, then the switch controller 120 determines that the load 130 should be powered via the USB connection. In that case, the switch controller 120 drives the I/O connection pin 122 low, which turns on p-type transistors M1 and M2, thereby enabling power from the USB node 102 to flow through transistors M1 and M2 to the load 130.

In addition, power from the USB node 102 also drives node Vrec (at the input of the LDO rectifier 118) high via a zener diode D1. The LDO rectifier 118 is turned on and off by a control signal 124, where the LDO rectifier 118 is turned off when the control signal 124 is asserted and turned on when the control signal 124 is de-asserted. In one implementation, the control signal 124 is equal to the logical AND of USB_good and USB_enable. If the software-based system controller that generates USB_enable is on-chip, then the software-based system controller is part of the load 130. In that case, when wireless power is not provided from the transmitter 112, diode D1 helps to clamp vrec and thereby provide power via the LDO rectifier 118 to the on-chip software-based system controller to keep it "alive" (i.e., functioning).

If either or both of USB_good and USB_enable are de-asserted (i.e., logic 0), then the switch controller 120 determines that the load 130 should be powered via the wireless power transfer path 110. In that case, the switch controller 120 drives the I/O connection pin 122 high, which turns off p-type transistors M1 and M2, thereby enabling power from the wireless power transfer path 110 to flow to the load 130. Note that, when transistors M1 and M2 are off, nodes Vout and Vusb are isolated from one another.

In a typical consumer electronic device application, everything in FIG. 1, except for the wireless power transmitter 112, is part of the consumer electronic device, while the wireless power transmitter 112 is part of a device, such as a docking station, that can power the consumer electronic device wirelessly when the consumer electronic device is placed on the docking station.

When the consumer electronic device is removed from the docking station and wireless power is not available, but there is a valid USB connection, then the electronic system 100 needs to be powered by Vusb and not Vout. In addition, the transistors M1 and M2 need to be turned off during start-up to isolate Vout and Vusb from each other until the USB_good and USB_enable signals are both asserted.

To achieve this functionality and as described in further detail below, at start-up, the switch controller 120 ensures that M1 and M2 are both off. In that case, voltage Vusb will be applied to node Vrec via diode D1, which enables the LDO rectifier 118 to provide power to node Vout and thereby to the load 130, even in the absence of wireless power from the transmitter 112.

When USB_good and USB_enable are eventually both asserted (and therefore also the control signal 124), and transistors M1 and M2 are both turned on, power will flow from the USB node 102 to the load 130 via transistors M1 and M2. In that case, Vout and Vusb will be equivalent. Since asserting the control signal 124 turns off the LDO rectifier 118, no power will flow from the H bridge rectifier 116 to Vout, even if wireless power from the transmitter 112 is available. In some embodiments, the software-based system controller sends a command to turn off the transmitter 112 before asserting USB_enable.

When wireless power is available, if a valid USB connection is subsequently removed (e.g., a USB connector is removed from its corresponding USB port), then the switch controller 120 will de-assert USB_good, transistors M1 and M2 will be turned off, and the electronic system 100 will re-start as if from power up with only wireless power available. In that case, the control signal 124 will be de-asserted, turning on the LDO rectifier 118 and thereby allowing power from the H bridge rectifier 116 to flow to Vout and the load 130. Diode D1 will prevent power from flowing from node Vrec to the USB node 102. Diode D1 will also prevent voltage Vrec from being applied to the switch controller 120 as voltage Vusb.

Figure 2:
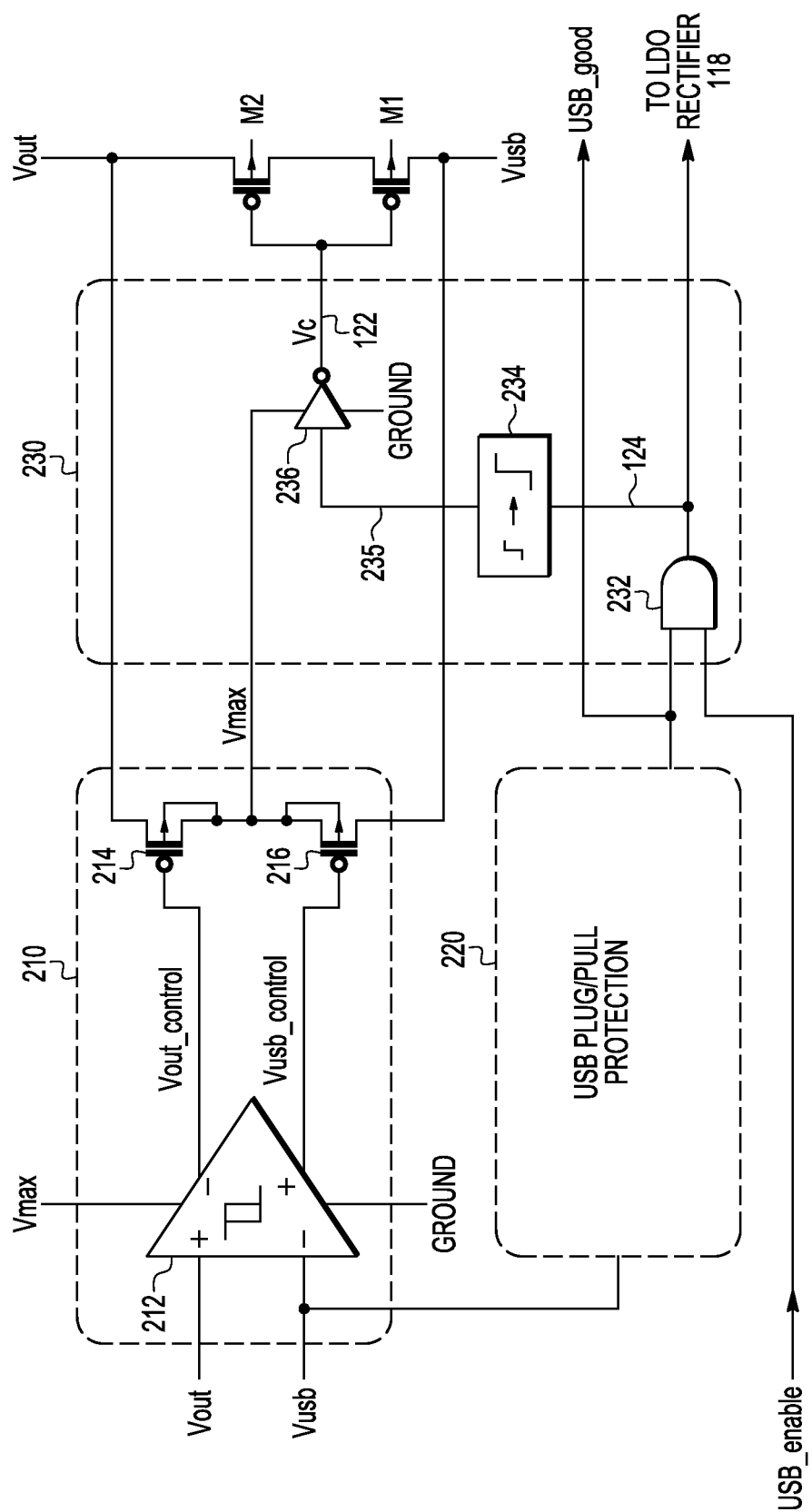
FIG. 2 is a schematic block diagram of the switch controller of FIG. 1 according to one embodiment of the invention.

FIG. 2 is a schematic block diagram of the switch controller 120 of FIG. 1, according to one embodiment of the invention. As shown in FIG. 2, the switch controller 120 comprises a maximum (max) voltage selector 210, USB plug/pull protection block 220, and switch ON/OFF block 230.

The max voltage selector 210 (i) monitors the voltage Vout from the wireless power transfer path 110 of FIG. 1 and the voltage Vusb at the USB node 102, (ii) determines which voltage is greater, and (iii) drives node Vmax to that determined greater voltage.

In particular, a differential comparator 212 compares Vout to Vusb and generates signals Vout_control and Vusb_control based on whether Vout or Vusb is greater. If Vout is greater than Vusb, then Vout_control will be low, and Vusb_control will be high. In that case, p-type (e.g., PMOS) transistor 214 will be on, p-type transistor 216 will be off, and node Vmax will be driven to Vout through the transistor 214. On the other hand, if Vusb is greater than Vout, then Vout_control will be high, and Vusb_control will be low. In that case, the transistor 214 will be off, the transistor 216 will be on, and node Vmax will be driven to Vusb through the transistor 216. Note that the comparator 212, which is powered by Vmax, may be implemented with hysteresis to prevent undesirable toggling of node Vmax between Vout and Vusb.

As described in further detail below, the USB plug/pull protection block 220 determines whether the voltage Vusb corresponds to a valid USB voltage level indicating that a valid USB connection exists at the USB node 102. In that case, the USB plug/pull protection block 220 asserts the control signal USB_good. As shown in FIG. 2, the control signal USB_enable, which passes through (or alternatively bypasses) the USB plug/pull protection block 220, is applied to the switch ON/OFF block 230 along with USB_good.

An AND gate 232 of the switch ON/OFF block 230 applies the logical "AND" operation to USB_good and USB_enable to generate the control signal 124 of FIG. 1. If both USB_good and USB_enable are asserted (i.e., logic 1), then the control signal 124 will be driven high in the voltage domain shared by USB plug/pull protection block 220 and the AND gate 232. Otherwise, the control signal 124 will be driven low.

A level shifter 234 provides voltage-domain transfer from the (lower) voltage domain of the USB plug/pull protection block 220 to the (higher) voltage domain of an inverter 236, which is powered by voltage Vmax, to convert the control signal 124 into a level-shifted control signal 235. The inverter 236 inverts the control signal 235 to generate the control voltage Vc at the I/O connection pin 122.

In operation, the max voltage selector 210 ensures that node Vmax is driven to the greater of Vout and Vusb, which is used to power the inverter 236. If the USB plug/pull protection block 220 determines that there is a valid USB connection at the USB port and if USB_enable is asserted, then the control signals 124 and 235 will be asserted (in their respective voltage domains), and control voltage Vc will be low, thereby turning on transistors M1 and M2 and powering the load 130 of FIG. 1 via the valid USB connection.

On the other hand, if the USB plug/pull protection block 220 determines that there is not a valid USB connection at the USB port or if USB_enable is not asserted, then the control signals 124 and 235 will be de-asserted (in their respective voltage domains), and control voltage Vc will be high, thereby turning off transistors M1 and M2 and powering the load 130 of FIG. 1 via the wireless power transfer path 110 of FIG. 1. Powering the inverter 236 at the greater of Vout and Vusb (i.e., Vmax) ensures that the inverter 236 will be able to turn off transistors M1 and M2.

At power up, Vmax is generated by the parasitic diode formed by the transistors 214 and 216. As such, even when the chip is in its startup phase, the voltage Vmax will be close to the maximum of Vout and Vusb (i.e., max(Vout, Vusb)), and the voltage Vc will also be close to max(Vout, Vusb). When Vmax becomes sufficiently high with one or both of Vout and Vusb rising over time, the comparator 212 will begin to operate normally such that Vout_control and Vusb_control will decide the max(Vout,Vusb) value for Vmax. Typically, the operating voltage for the comparator 212 is quite low, about 1-2 volts.

Figure 3:
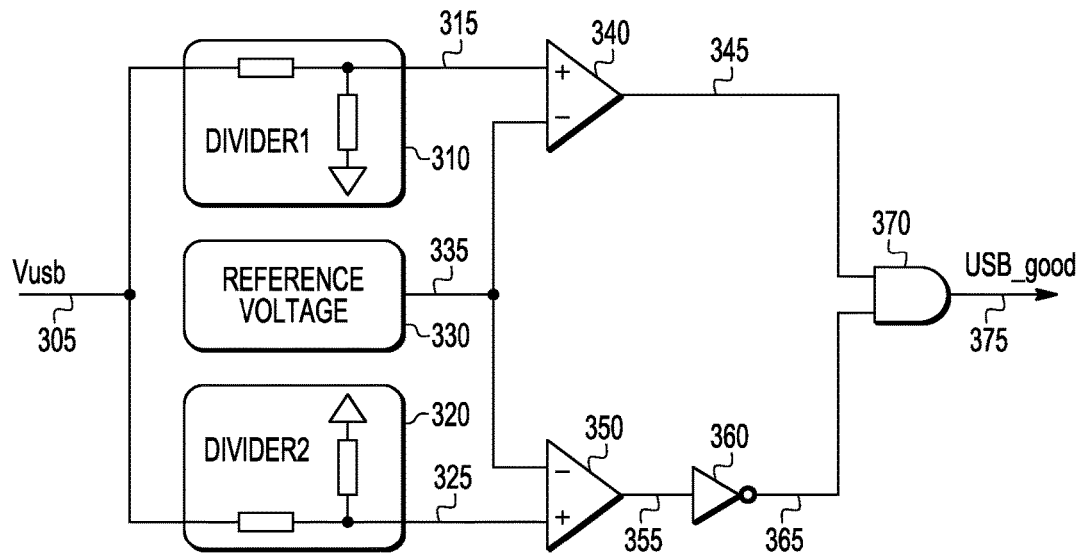
FIG. 3 is a schematic block diagram of the USB plug/pull protection block of FIG. 2 according to one embodiment of the invention.

FIG. 3 shows a schematic block diagram of the USB plug/pull protection block 220 of FIG. 2, according to one embodiment of the invention. The protection block 220 determines whether or not the voltage Vusb at an input node 305 is at a valid USB voltage level. In one possible implementation, a valid USB voltage level will be between about 4.5 v and about 5.5 v. The protection block 220 determines whether or not the voltage Vusb is between those upper and lower USB voltage threshold levels. If so, then the protection block 220 drives control signal USB_good at na output node 375 high (i.e., logic 1). Otherwise, the protection block 220 drives USB_good low (i.e., logic 0).

The voltage Vusb is divided in parallel by two different voltage dividers 310 and 320 applying different divisor values, where the divisor value of the divider 310 is smaller than the divisor value of the divider 320. The resulting, divided voltage signals 315 and 325 are respectively compared to a reference voltage signal 335 from a voltage reference source 330 by two comparators 340 and 350 to generate two comparator output signals 345 and 355, which are then processed by logic circuitry including an inverter 360 and an AND gate 370 to generate USB_good at an output node 375.

In one possible implementation in which valid USB voltages are between 4.5 v and 5.5 v, the divisor value of the divider 310 is 1.8, the divisor value of the divider 320 is 2.2, and the reference voltage signal 335 is 2.5 v. Note that, in another possible implementation, the reference voltage signal 335 is generated by a bandgap module at 1.2 v in order to be constant across process, voltage, and temperature (PVT). In that case, different, appropriate divisor values would be applied by the dividers 310 and 320.

In that case, when the voltage Vusb is less than 4.5 v, then the divided voltage signals 315 and 325 will both be less than 2.5 v. As such, the output signals 345 and 355 from the comparators 340 and 350 will both be low (i.e., logic 0), an inverted signal 365 will be high, and USB_good will be low, indicating that Vusb is outside (in this case, below) the valid USB-voltage range.

When Vusb is greater than 4.5 v, but less than 5.5 v, then the divided voltage signal 325 will be less than 2.5 v, but the divided voltage signal 315 will be greater than 2.5 v. As such, the output 355 of the comparator 350 will be low, but the output 345 of the comparator 340 will be high. In that case, the inverted signal 365 will be high, and USB_good will be high, indicating that Vusb is within the valid USB-voltage range.

When Vusb is greater than 5.5 v, then the divided voltage signals 315 and 325 will both be greater than 2.5 v. As such, the outputs 345 and 355 of the comparators 340 and 350 will both be high, inverted signal 365 will be low, and USB_good will again be low, indicating that Vusb is outside (in this case, above) the valid USB-voltage range.

Note that, when the voltage Vusb is above the valid USB-voltage range, if Vusb is greater than Vout, then Vmax will still be driven to Vusb, even though the load will be powered by Vout, to ensure that transistors M1 and M2 are securely turned off.

Although the protection block 220 has been described in the context of circuitry that determines whether or not the voltage Vusb is between lower and upper USB voltage thresholds, in other embodiments, the protection block 220 of FIG. 2 may be implemented using only a single comparator that determines whether or not the voltage Vusb is above a specified lower USB voltage threshold. In those embodiments, a valid USB connection is assumed to exist whenever the voltage Vusb is above the lower USB voltage threshold.

Figure 4:
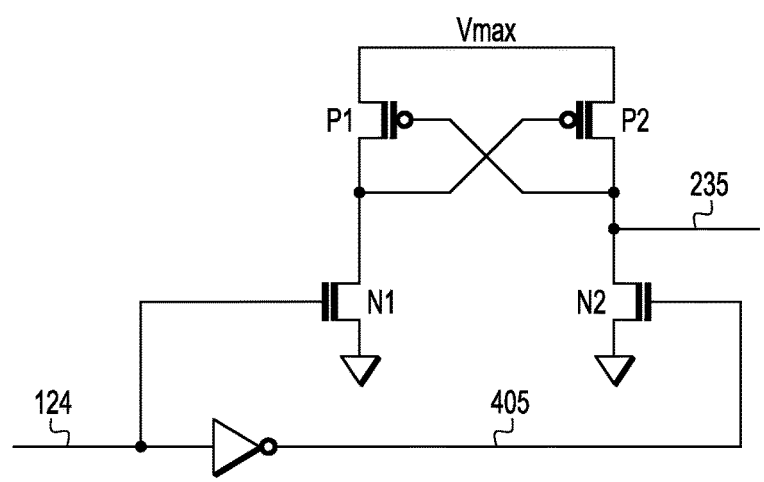
FIG. 4 is a schematic circuit diagram of the level shifter of FIG. 2 according to one embodiment of the invention.

FIG. 4 shows a schematic circuit diagram of the level shifter 234 of FIG. 2, according to one embodiment of the invention. When the input control signal 124 of FIG. 2, in the input voltage domain of the protection block 220, is low, then an inverted signal 405 is high, n-type (e.g., NMOS) transistor N1 is off, n-type transistor N2 is on, and the level-shifted control signal 235 of FIG. 2 will be driven low. The control signal 235 low turns on p-type (e.g., PMOS) transistor P1, which drives the gate of p-type transistor P2 high (i.e., to Vmax), which ensures that transistor P2 is off, thereby avoiding current flow from Vmax to ground via transistors P2 and N2.

Alternatively, when the input control signal 124 is high in the input voltage domain of the protection block 220, then the inverted signal 405 is low, transistor N1 is on, transistor N2 is off, and the gate of transistor P2 is driven low through transistor N1. Driving the gate of transistor P2 low, turns on transistor P2, which drives the level-shifted control signal 235 high in the output voltage domain defined by Vmax. The control signal 235 high ensures that transistor P1 is off, thereby avoiding current flow from Vmax to ground via transistors P1 and N1.

Although the present invention has been described in the context of an electrical system that can power a load via either a wireless power transfer path or via a USB connection, in alternative embodiments, the other power source need not be via wireless power transfer. For example, the other power source may be via conventional wired power transfer, such as, via a conventional AC adapter.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this disclosure, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal-oxide semiconductor (MOS) transistor device (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when an embodiment of the invention is implemented using bi-polar transistor technology.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. An apparatus including switch control circuitry that controls Universal Serial Bus (USB) power transfer circuitry used to selectively convey power from a USB connection to a load, wherein the load can also be powered by another power source, the switch control circuitry comprising:
   switch on/off circuitry comprising an inverter connected to generate a control signal used to control the USB power transfer circuitry;
   voltage selection circuitry that (a) selects the greater of (i) a USB voltage corresponding to the USB connection and (ii) another voltage corresponding to the other power source and (b) powers the inverter of the switch on/off circuitry based on the selected greater voltage; and
   USB detection circuitry that determines whether or not the USB connection is valid and controls the switch on/off circuitry accordingly, and
   wherein the switch on/off circuitry further comprises:
   logic circuitry configured to generate a logic signal in a first voltage domain; and
   a level shifter connected to shift the logic signal from the first voltage domain to the voltage domain of the selected greater voltage to drive the inverter.

2. The apparatus of claim 1, wherein the USB power transfer circuitry comprises two transistors connected between the USB connection and the load.

3. The apparatus of claim 2, wherein:
   the switch control circuitry is implemented on an integrated circuit;
   the two transistors are implemented external to the integrated circuit; and
   the switch control circuitry controls the two transistors via a single input/output pin connection of the integrated circuit.

4. The apparatus of claim 2, wherein:
   the two transistors are two p-type transistors connected in series; and
   bulk terminals of the two transistors are connected to common channel terminals of the two transistors.

5. The apparatus of claim 1, wherein the other power source is a wireless power transfer path.

6. The apparatus of claim 1, wherein the voltage selection circuitry comprises:
   a differential comparator connected to compare the USB voltage and the other voltage and generate two differential control signals based on the greater of the USB voltage and the other voltage; and
   a pair of transistors controlled by the two differential control signals to drive an output node of the voltage selection circuitry to the selected greater voltage.

7. The apparatus of claim 6, wherein the differential comparator is powered by the selected greater voltage.

8. The apparatus of claim 1, wherein the USB detection circuitry comprises a first comparator connected to determine whether the USB voltage is above a specified lower USB threshold voltage.

9. The apparatus of claim 8, wherein the USB detection circuitry further comprises:
   a second comparator connected to determine whether the USB voltage is below a specified upper USB threshold voltage; and
   logic circuitry connected to determine whether or not the USB voltage is between the lower and upper USB threshold voltages.

10. The apparatus of claim 9, wherein the USB detection circuitry further comprises:
    a first voltage divider connected to generate a first divided voltage from the USB voltage;
    a second voltage divider connected to generate a second divided voltage from the USB voltage; and
    a reference voltage source connected to provide a voltage reference signal, wherein:
    the first comparator compares the first divided voltage to the voltage reference signal to determine whether the USB voltage is above the specified lower USB threshold voltage; and
    the second comparator compares the second divided voltage to the voltage reference signal to determine whether the USB voltage is below the specified upper USB threshold voltage.

11. The apparatus of claim 1, wherein the apparatus further comprises the USB power transfer circuitry and the load.

12. The apparatus of claim 11, wherein the apparatus is a consumer electronic device.

13. The apparatus of claim 1, wherein:

the USB power transfer circuitry comprises two transistors connected between the USB connection and the load;

the switch control circuitry is implemented on an integrated circuit;

the two transistors are implemented external to the integrated circuit;

the switch control circuitry controls the two transistors via a single input/output pin connection of the integrated circuit;

the two transistors are two p-type transistors connected in series;

bulk terminals of the two transistors are connected to common channel terminals of the two transistors;

the other power source is a wireless power transfer path;

the voltage selection circuitry comprises:
- a differential comparator connected to compare the USB voltage and the other voltage and generate two differential control signals based on the greater of the USB voltage and the other voltage; and
- a pair of transistors controlled by the two differential control signals to drive an output node of the voltage selection circuitry to the selected greater voltage;

the differential comparator is powered by the selected greater voltage;

the USB detection circuitry comprises:
- a first comparator connected to determine whether the USB voltage is above a specified lower USB threshold voltage;
- a second comparator connected to determine whether the USB voltage is below a specified upper USB threshold voltage;
- logic circuitry connected to determine whether or not the USB voltage is between the lower and upper USB threshold voltages;
- a first voltage divider connected to generate a first divided voltage from the USB voltage;
- a second voltage divider connected to generate a second divided voltage from the USB voltage; and
- a reference voltage source connected to provide a voltage reference signal, wherein:

the first comparator compares the first divided voltage to the voltage reference signal to determine whether the USB voltage is above the specified lower USB threshold voltage; and the second comparator compares the second divided voltage to the voltage reference signal to determine whether the USB voltage is below the specified upper USB threshold voltage; and the apparatus further comprises the USB power transfer circuitry and the load.

* * * * *